(12) United States Patent
Martinez

(10) Patent No.: US 11,943,891 B2
(45) Date of Patent: Mar. 26, 2024

(54) METHOD AND APPARATUS FOR ELECTRONICS RACK ASSEMBLY AND TRANSPORTATION

(71) Applicant: Gulfstream Aerospace Corporation, Savannah, GA (US)

(72) Inventor: Jose Antonio Martinez, Savannah, GA (US)

(73) Assignee: GULFSTREAM AEROSPACE CORPORATION, Savannah, GA (US)

(*) Notice: Subject to any disclaimer, the term of this patent is extended or adjusted under 35 U.S.C. 154(b) by 810 days.

(21) Appl. No.: 15/929,549

(22) Filed: May 8, 2020

(65) Prior Publication Data

US 2021/0352819 A1 Nov. 11, 2021

(51) Int. Cl.
*H05K 7/18* (2006.01)
*B64D 41/00* (2006.01)
*B64F 5/50* (2017.01)
*B62B 3/00* (2006.01)

(52) U.S. Cl.
CPC ............ *H05K 7/18* (2013.01); *B64F 5/50* (2017.01); *B62B 3/00* (2013.01)

(58) Field of Classification Search
CPC .... H05K 7/1412; H05K 7/18; H05K 7/20572; H05K 7/1497; H05K 7/183; H05K 5/0204; H05K 5/0217; H05K 7/14325; B64D 2013/0614; B64D 13/00; B64D 9/003; B64C 1/061; B64C 1/20; B64C 1/22; A47B 2200/0069; A47B 45/00; A47B 46/00; B60R 11/00; H02J 2310/44; H04Q 1/09
See application file for complete search history.

(56) References Cited

U.S. PATENT DOCUMENTS

| | | | | |
|---|---|---|---|---|
| 5,603,486 A | * | 2/1997 | Liu ...................... | B66F 3/245 254/93 H |
| 5,806,687 A | * | 9/1998 | Ballesteros .............. | H05K 7/16 211/26 |
| 6,238,029 B1 | * | 5/2001 | Marzec .................. | H02B 1/565 312/265.5 |
| 7,659,476 B2 | * | 2/2010 | Hruby ...................... | H04Q 1/06 439/535 |
| 8,297,450 B2 | * | 10/2012 | Zavidniak .............. | H05K 7/183 211/13.1 |
| 8,657,312 B2 | * | 2/2014 | Guasta ...................... | H02J 7/00 280/37 |

(Continued)

*Primary Examiner* — Michael A Matey
(74) *Attorney, Agent, or Firm* — LKGLOBAL | Lorenz & Kopf, LLP

(57) ABSTRACT

The present application relates to providing mechanical and environmental protection to an electronics rack including a frame configured in a vertical orientation configured to receive an electronics rack, a front cover and a back cover, wherein the front cover and the back cover are configured to enclose the electronics rack when the front cover is attached to the frame and when the back cover is attached to the frame, a first fastener for mechanically coupling a top portion of the electronics rack to a top portion of the frame, a second fastener for coupling a bottom portion of the electronics rack to a bottom portion of the frame and a horizontal base for supporting the frame, the base including a mechanical interface for a material handling device, at least one castor and at least one floor lock.

11 Claims, 6 Drawing Sheets

(56) References Cited

U.S. PATENT DOCUMENTS

| | | | | |
|---|---|---|---|---|
| 8,717,776 B2* | 5/2014 | Colongo | H05K 7/1449 |
| | | | 361/807 |
| 8,901,418 B2* | 12/2014 | Walker | H05K 7/1491 |
| | | | 211/26 |
| 9,801,302 B2* | 10/2017 | Huang | H05K 7/186 |
| 9,999,147 B1* | 6/2018 | Quick | H05K 7/1401 |
| 10,076,049 B2* | 9/2018 | Nordin | H05K 7/183 |
| 11,760,283 B2* | 9/2023 | Sainclivier | H05K 9/005 |
| | | | 361/679.01 |
| 2002/0153814 A1* | 10/2002 | Robideau | H05K 7/183 |
| | | | 312/265.4 |
| 2005/0109996 A1* | 5/2005 | Razzaghi | B66F 3/44 |
| | | | 254/126 |
| 2007/0091550 A1* | 4/2007 | Smith | H05K 7/1488 |
| | | | 361/679.02 |
| 2007/0236881 A1* | 10/2007 | Harder | H05K 7/202 |
| | | | 165/104.33 |
| 2009/0201640 A1* | 8/2009 | Bard | H05K 7/20745 |
| | | | 361/696 |
| 2010/0007250 A1* | 1/2010 | Sharpe | A61G 12/001 |
| | | | 312/209 |
| 2011/0194269 A1* | 8/2011 | Colongo | H05K 7/1448 |
| | | | 361/807 |
| 2012/0306335 A1* | 12/2012 | Herreid, II | A47B 81/002 |
| | | | 312/238 |
| 2013/0021733 A1* | 1/2013 | Demange | H05K 7/1497 |
| | | | 361/679.02 |
| 2013/0077279 A1* | 3/2013 | Tomasi | B64C 1/22 |
| | | | 361/807 |
| 2014/0161410 A1* | 6/2014 | Thijs | G02B 6/4471 |
| | | | 29/825 |
| 2018/0332962 A1* | 11/2018 | Pappas | H05K 7/1401 |
| 2019/0021178 A1* | 1/2019 | Zumbek | H05K 5/0004 |
| 2020/0024113 A1* | 1/2020 | Brasola | B66F 3/12 |
| 2020/0267853 A1* | 8/2020 | Merrell | H05K 7/186 |
| 2021/0153375 A1* | 5/2021 | Bailey | H05K 7/1497 |

* cited by examiner

METHOD AND APPARATUS FOR ELECTRONICS RACK ASSEMBLY AND TRANSPORTATION

BACKGROUND

The present disclosure relates generally to methods and fixtures for assembly, transportation and installation of electronic instrument racks. More specifically, aspects of this disclosure relate to systems, methods and devices for providing a rigid fixture for supporting and restraining an aircraft instrument rack including an outer structure affixed to the instrument rack to provide rigidity, environmental protection and handling features for assembly, transportation, and installation of the aircraft instrument rack.

Aircraft radio racks are one of the costliest electrical components in an aircraft. These racks include sensitive, sophisticated and critical communications equipment for air to ground, satellite, weather and data reception, interphone, and cabin communications Like all aircraft components, the equipment rack used to hold the equipment is fabricated in a manner to reduce as much weight as possible when installed in the aircraft. These equipment racks are designed to provide equipment restraint and protection while integrated into the aircraft but may be susceptible to damage and distortion when the rack is not installed, such as during fabrication and transportation.

Traditionally, wooden crates are constructed to transport the assembled aircraft radio racks between a fabrication facility and an aircraft assembly facility. These facilities are often located long distances apart and the crates holding the radio racks are transported by truck between facilities. These wooden crates are somewhat flexible as a result of their wooden and fastener construction and may cause quality issues during transportation. The radio rack structure is a very critical delicate part and the excessive material handling causes not only quality issues but also safety risks during unpacking of the radio racks. In addition, once the radio racks have been unpacked, the radio rack must be lifted into the aircraft during installation where each radio rack may weigh more than 500 lbs. During this installation, the radio rack is highly susceptible to damage or physical distortion. In addition, fabrication, installation, and unpacking of the radio rack requires the use of power tools which may further result in damage to the radio rack, requires excessive technician time and may result in lost parts, misplaced parts, damaged packaging, and the need for disposal of packing materials. It would be desirable to provide a method and apparatus for secure electronics rack assembly and transportation while overcoming the aforementioned problems. In addition, other desirable features and characteristics will become apparent from the subsequent summary and detailed description, and the appended claims, taken in conjunction with the accompanying drawings and this background.

The above information disclosed in this background section is only for enhancement of understanding of the background of the invention and therefore it may contain information that does not form the prior art that is already known in this country to a person of ordinary skill in the art.

SUMMARY

Disclosed herein are fixtures, devices and systems and for providing secure electronics rack for assembly and transportation, methods for making and methods for operating such systems, and vehicles equipped with such systems. By way of example, and not limitation, there is presented an aircraft system transportation for rigidly securing an aircraft electronics system rack during assembly, transportation and installation while facilitating environmental protection and material handling of the aircraft electronics system rack.

In accordance with an aspect of the present disclosure, an apparatus including, but not limited to a frame configured in a vertical orientation configured to receive an electronics rack, a front cover and a back cover, wherein the front cover and the back cover are configured to enclose the electronics rack when the front cover is attached to the frame and when the back cover is attached to the frame, a first fastener for mechanically coupling a top portion of the electronics rack to a top portion of the frame, a second fastener for coupling a bottom portion of the electronics rack to a bottom portion of the frame, and a horizontal base for supporting the frame, the base including a mechanical interface for a material handling device, at least one castor and at least one floor lock In accordance with another aspect of the present disclosure a method including installing an electronics rack into a transportation frame having a vertical orientation wherein an upper portion of the electronics rack is coupled to an upper portion of the transportation frame and a lower portion of the electronics rack is coupled to a lower portion of the transportation frame wherein the transportation frame further includes a horizontal base for supporting the transportation frame, the base including a mechanical interface for a material handling device, at least one castor and at least one floor lock, installing an electronic component into the electronics rack, affixing a front cover to a front side of the transportation frame, and affixing a back cover to a back side of the transportation frame.

In accordance with another aspect of the present disclosure a frame having a vertical orientation configured for supporting an electronics rack, the frame having an upper mechanical fastener for securing an upper portion of the electronics rack, a lower mechanical fastener for securing a lower portion of the electronics rack, a left side clamp for providing a first lateral force between a left side of the frame and a left side of the electronics rack, a right side clamp for providing a second lateral force between a right side of the frame and a right side of the electronics rack, a front cover configured to be affixed to a front side of the frame, a back cover configured to be affixed to a back side of the frame such that the back cover and the front cover enclose the electronics rack when the front cover is affixed to the front side of the frame and the back cover is affixed to the back side of the frame, a horizontal base for supporting the frame, the base including a mechanical interface for a material handling device, at least one castor and at least one floor lock.

The above advantage and other advantages and features of the present disclosure will be apparent from the following detailed description of the preferred embodiments when taken in connection with the accompanying drawings.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings.

The exemplifications set out herein illustrate preferred embodiments of the invention, and such exemplifications are not to be construed as limiting the scope of the invention in any manner.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting but are merely representative. The various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
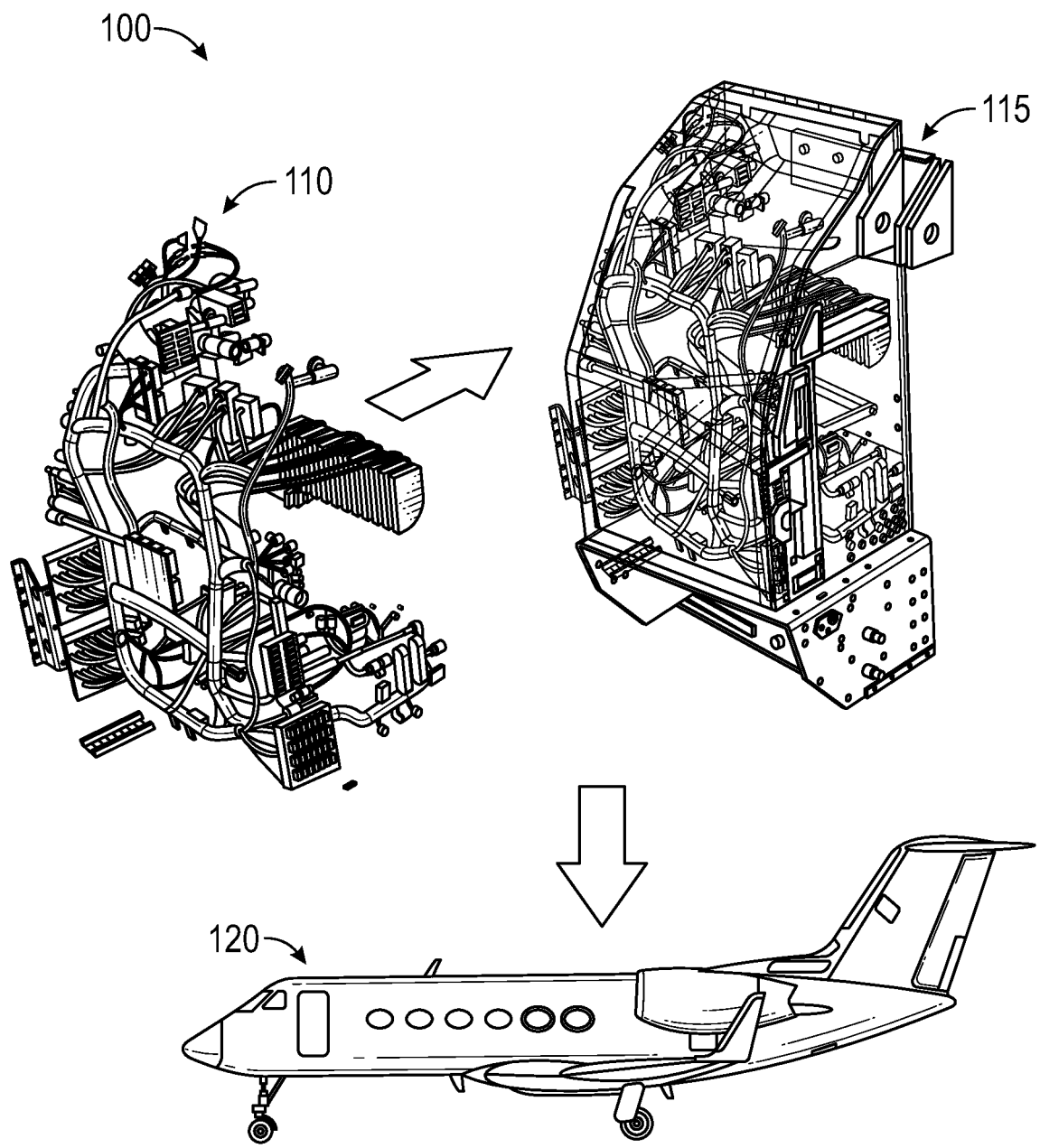
FIG. 1 shows an exemplary operating environment for providing a secure electronics rack for assembly and transportation according to an exemplary embodiment of the present disclosure.

FIG. 1 schematically illustrates an exemplary operating environment 100 for providing a secure electronics rack for assembly and transportation according to an exemplary embodiment of the present disclosure. The exemplary operating environment 100 depicts an aircraft electronic components assembly 110 including radio components and interconnecting cabling. In this exemplary embodiment, the electronic components assembly 110 is integrated into an aircraft electronics component rack 115. The aircraft electronics component rack 115 is configured to be installed in an aircraft 120.

In this exemplary embodiment, the electronic components assembly 110 may be assembled within the aircraft electronics component rack 115 or may be assembled separately and then integrated into the aircraft electronics component rack 115. The electronic components assembly 110 may include very high frequency (VHF) transmitters and receivers for communications and navigations, satellite transmitters and receivers, automatic direction finding (ADF) receivers, weather radar, radar altimeter, global positioning system (GPS), ground proximity warning system (GPWS), and other electromagnetic wave communications transmitters and receivers. These components are typically integrated within an equipment rack, such as the aircraft electronics component rack 115, within the aircraft 120. The aircraft electronics component rack 115 may be installed within the aircraft in such a way that the airframe provides additional rigidity and stability to the aircraft electronics component rack 115 once installed. For example, since it is desirable that all aircraft systems are lightweight to reduce fuel consumption and structural loading, the aircraft electronics component rack 115 may be fabricated from thin, lightweight metal components and therefore somewhat flexible and susceptible to physical damage before it is installed in the aircraft 120. Once installed in the aircraft 120, the aircraft electronics component rack 115 when integrated into the aircraft structure may then provide the desired level of rigidity and protection to the electronic components assembly 110.

Figure 2:
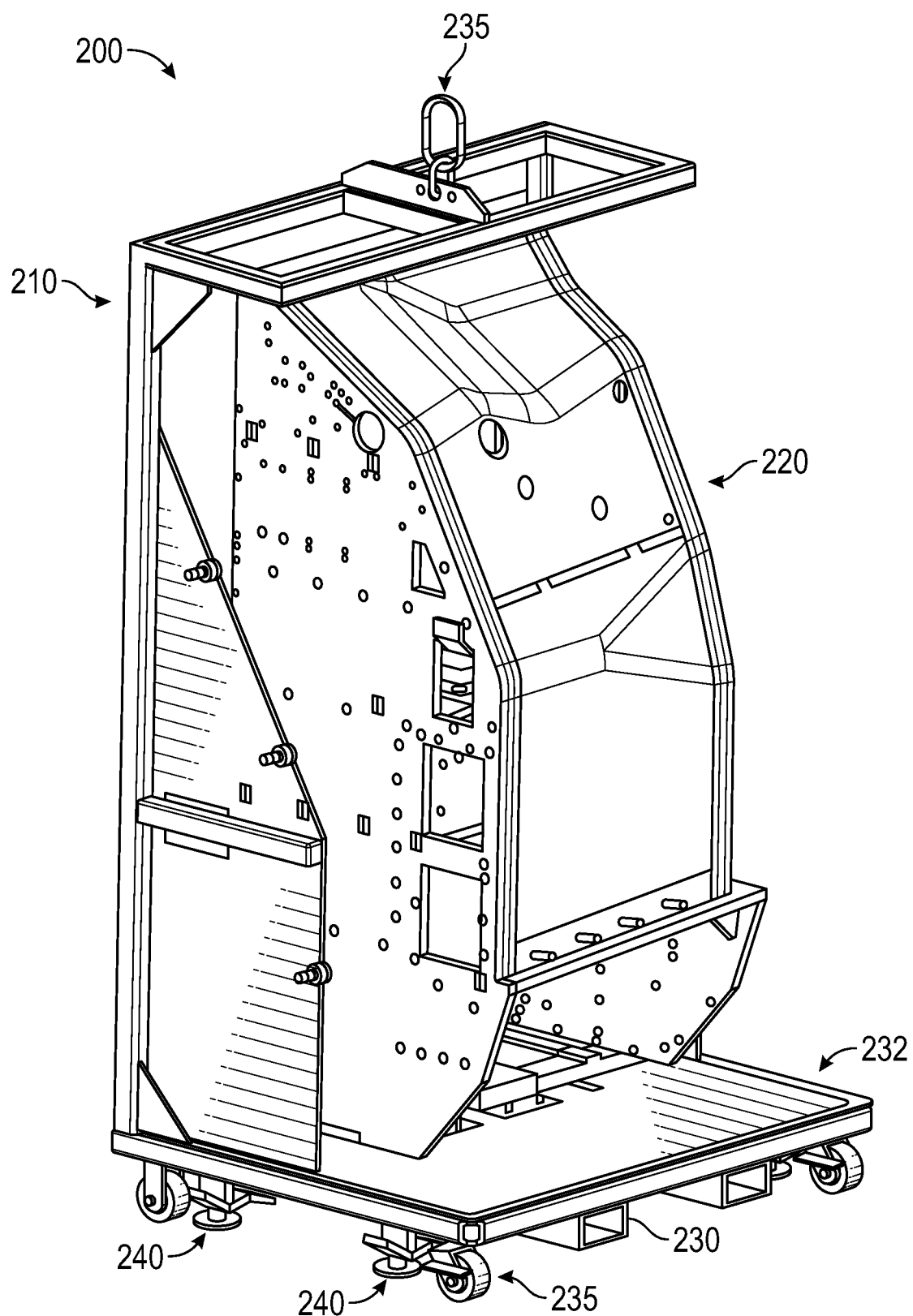
FIG. 2 shows an exemplary fixture for providing secure assembly and transportation of an electronics rack according to an exemplary embodiment of the present disclosure.

Turning now to FIG. 2, an exemplary fixture 200 for providing secure assembly and transportation of an electronics rack 220 according to an exemplary embodiment of the present disclosure is shown. In this exemplary embodiment, the fixture 200, may be a dolly, fabrication fixture, fabrication rack, or the like, for securely restraining an electronics rack 220 during assembly, transportation, and installation. The fixture 200 may further provide environmental protection to the electronics rack 220 during transportation. The exemplary fixture 200 may include a frame 210 for providing additional rigidity to the electronics rack 220. The top of the electronics rack 220 may be affixed using bolts or clamps at a top portion of the frame 210. Likewise, the electronics rack 220 may be affixed to the bottom of the frame 210 using bolts or clamps. These bolts or clamps affix the electronics rack 220 to the frame 210 in a manner that may provide lateral rigidity and stability to the electronics rack 220. In one exemplary embodiment, the bolts or clamps may be secured and unsecured using an Allen key. The Allen key may be part of a toolkit included with the fixture 200 during shipping.

In addition, the frame 210 may include a lifting eye 235 affixed to a top portion of the frame 235 to facilitate reception of a lifting hook of a crane or other material handling device. The lifting eye 235 may be a metal ring having a moveable gate wherein the metal ring may be inserted through an aperture on the frame 210 to enable a mechanical coupling facilitating lifting of the frame 210 by the lifting hook or lifting loop. The moveable gate may employ a locking sleeve to prevent unintentional opening of the gate. Alternatively, the lifting eye 235 may be welded or immovably affixed to the frame 210. The lifting eye 236 may be a flexible construction, such as a strap, fabric loop or the like.

The frame 210 may further include one or more fork slots 230 to provide a structure to facilitate lifting of the frame 210 from the bottom by a forklift. The fork slots 230 may be rectangular tubes running from a front of a frame base 232 to a rear of the frame base 232 configured to accept forks of a forklift. The fork slots 230 may be spaced at a fixed distance, such as twenty four inches, or may be adjustable within a range of spacings. In addition, one or more wheels 235, or castors, may be affixed to the frame base 232 to facilitating moving the frame 210. One or more floor locks 240 may be installed on the frame base 232 to prevent movement of the frame 210 when the floor locks 240 are anchored or engaged.

Figure 3:
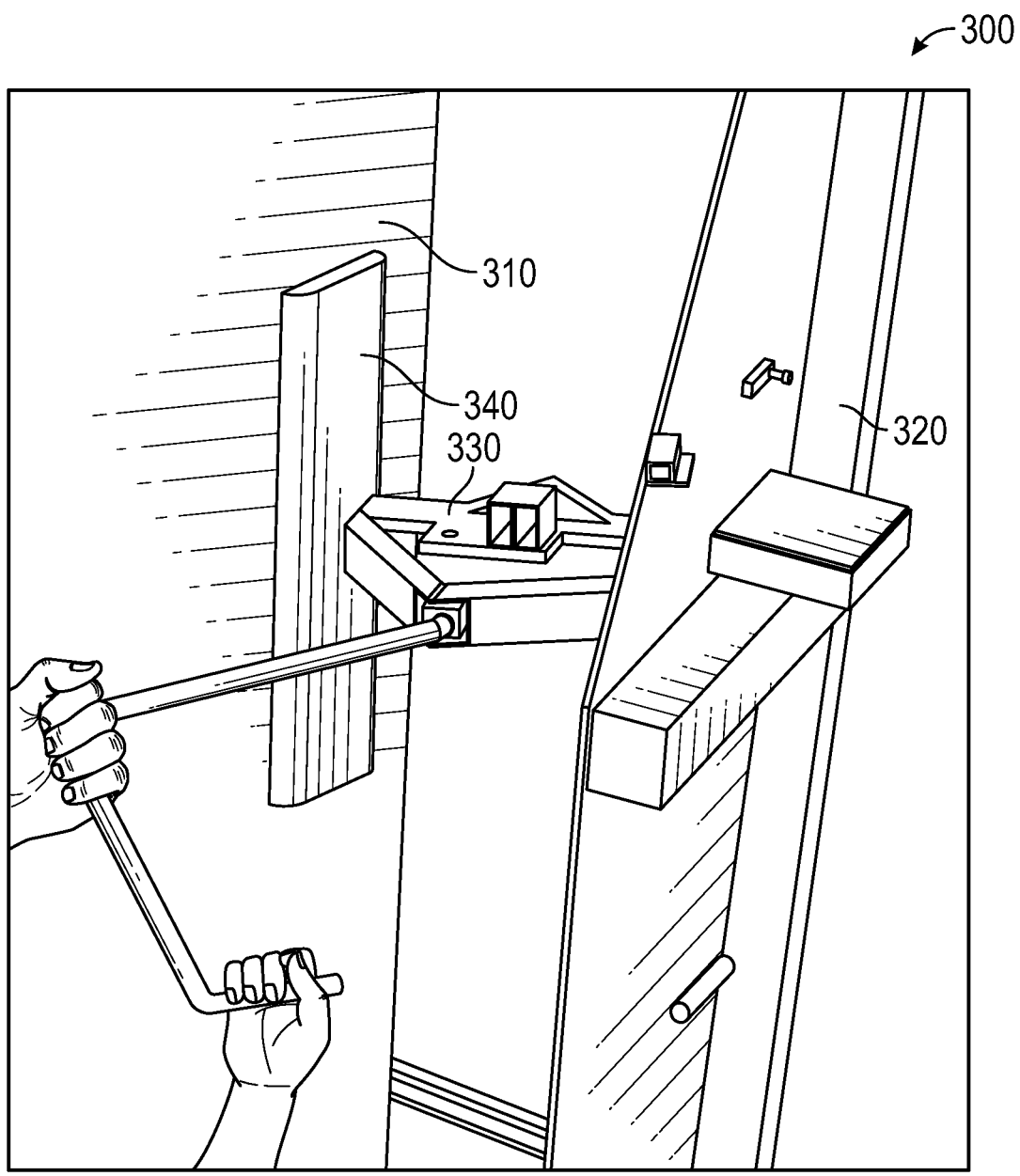
FIG. 3 shows an exemplary lateral support system for use with the exemplary fixture according to an exemplary embodiment of the current disclosure.

Turning now to FIG. 3, an exemplary lateral support system 300 for use with the exemplary fixture according to an exemplary embodiment of the current disclosure is shown. To provide additional lateral support to the electronics rack 310 during assembly and transportation, one or more adjustable clamps 330 may be affixed to a uptight portion of the frame 320 wherein the clamp pad 340 may be extended by the adjustable clamp 330 to contact and/or assert a pressure on a side of the electronics rack 310. In an exemplary embodiment, an adjustable clamp may be provided on one or more sides of the frame 320 to provide the clamping pressure such that the lateral support is provided. In one exemplary embodiment, the adjustable clamp 330 may be an extension clamp, such as a scissor clamp or the like, positioned at a midpoint on each side of the frame 320 to be adjustable laterally to position the clamp pad 340.

Figure 4:
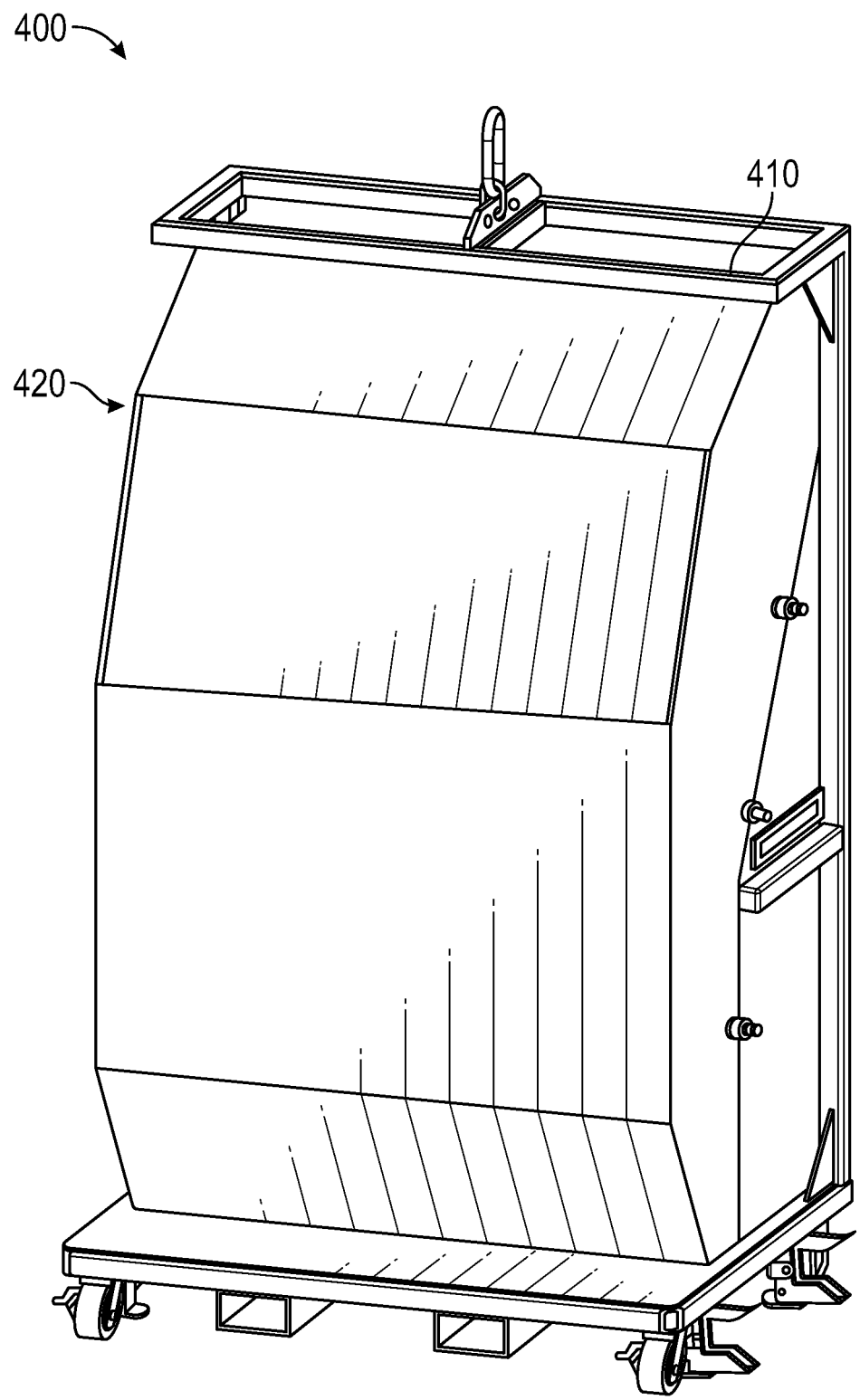
FIG. 4 illustrates a transportation configuration for the exemplary fixture 410 according to an exemplary embodiment of the current disclosure.

Turning now to FIG. 4, a diagram illustrating a transportation configuration 400 for the exemplary fixture 410 is shown. The fixture 410 may include one or more removeable covers 420 which may be installed to provide environmental protection for the electronics rack during transportation. In one exemplary embodiment, the transportation configuration 400 may include a plurality of removable covers 420 such as a front cover and a rear cover each conformed to the shape of the electronics rack such that the electronics rack is shielded on each side from outside environmental factors. The front cover may be fastened to the fixture 410 by one or more latches. Likewise, the rear cover may also be fastened to the fixture with latches. One or more of the latches may include a receiving a padlock to restrict opening of the latch. In one exemplary embodiment, the electronics rack is affixed to the fixture, the various electronic components are assembled within the electronics rack, the removeable covers 420 are installed over the completed electronics and the fixture is ready for shipment.

In addition, the removeable covers 420 may be constructed from an impact resistant material to provide impact protection for the electronics rack. The removeable covers 420 may be constructed from a rigid material, such as fiberglass, acrylonitrile butadiene styrene (ABS), polycarbonate, and/or metal. The removeable covers 420 may further include structural members integrated within the removeable covers 420 in order to provide additional rigidity to the removeable covers 420. For example, the structural member may be metal and integrated into an ABS removable cover. When latched to the frame of the fixture 410, the removeable covers 420 will be provided an additional level of structural rigidity to provide protection to the electronics rack during transportation of the fixture 410.

Figure 5:
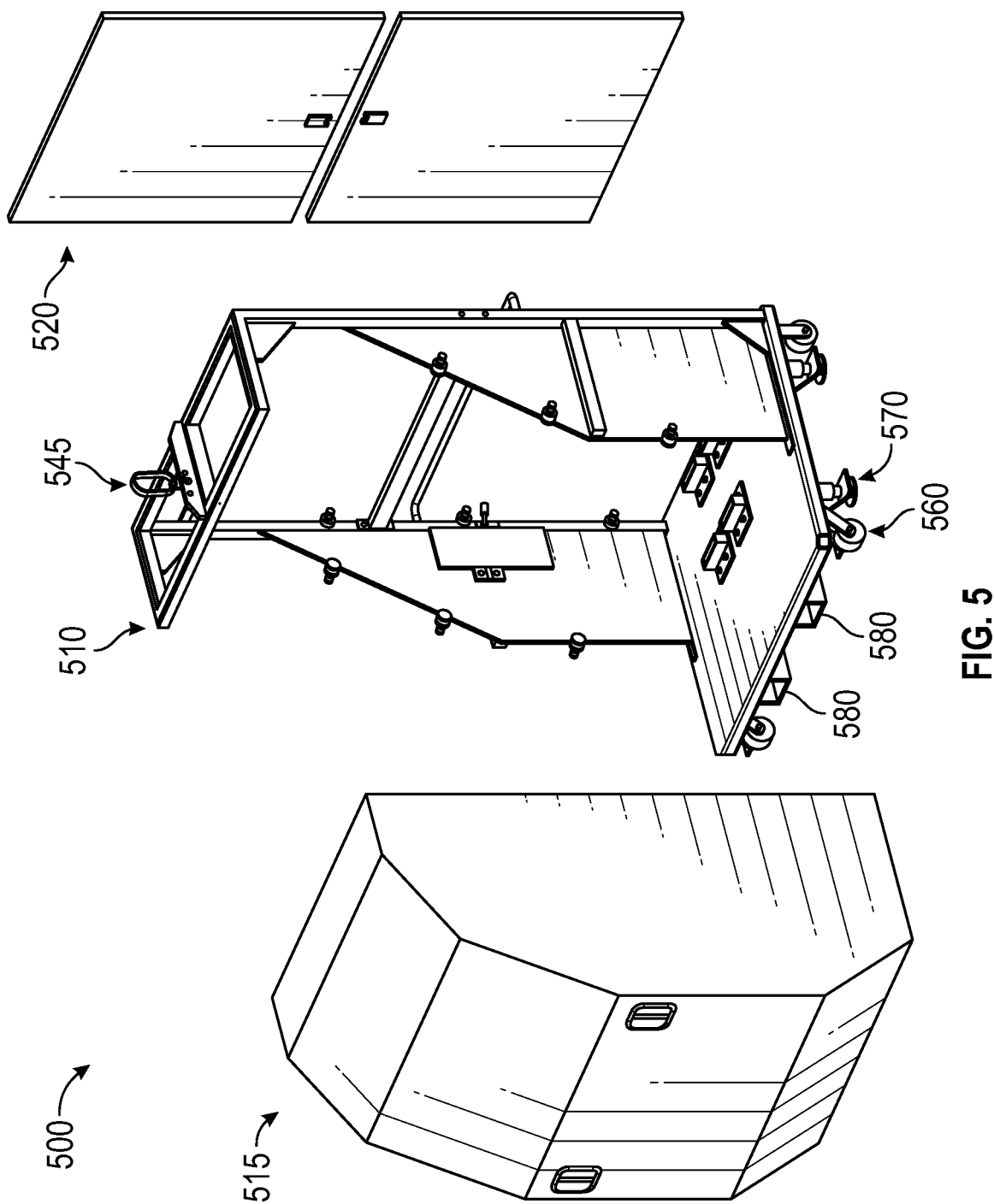
FIG. 5 shows an exemplary implementation of an apparatus for providing an exemplary transportation fixture for transporting an aircraft electronics rack according to an exemplary embodiment.

Turning now to FIG. 5, an exemplary implementation of an apparatus 500 for providing an exemplary electronics rack transportation fixture is shown. In this exemplary embodiment, an apparatus including a frame 510 configured in a vertical orientation configured to receive an electronics rack, a front cover 515 and a back cover 520, wherein the front cover 515 and the back cover 520 are configured to enclose the electronics rack when the front cover 515 is attached to the frame 510 and when the back cover 520 is attached to the frame 515. The electronics rack may be populated with an electronic component during assembly while the electronics rack is installed in the frame 510. The front cover 515 may be attached to a front of the frame 510 using a plurality of front cover latches 590. In addition, the back cover 520 is attached to a back of the frame 510 using a plurality of back cover latches 595. The exemplary frame 510 may further be configured to include a lifting ring 545 affixed to the top portion of the frame 510 for receiving a lifting hook or a corresponding lifting ring or the like.

The exemplary apparatus 500 may further include a first fastener 530 for mechanically coupling a top portion of the electronics rack to a top portion of the frame 510. In one exemplary embodiment, the first fastener 530 may include one or more nuts and bolts for coupling through a hole in the electronics rack and the first fastener 530 for securing the electronics rack to the frame 510. Alternatively, the first fastener 530 may be a mechanical clamp operated by a series of threaded rods actuated by an Allen key for applying a pinching pressure on the top portion of the electronics rack while the mechanical clamp is affixed to the frame 510.

The exemplary apparatus 500 may further include a second fastener 540 for coupling a bottom portion of the electronics rack to a bottom portion of the frame 510. The second fastener 540 may include one or more nuts and bolts for coupling through a hole in the electronics rack and the second fastener 540 for securing the electronics rack to the frame 510. Alternatively, the first fastener 530 may be a mechanical clamp operated by a series of threaded rods actuated by an Allen key for applying a pinching pressure on the lower portion of the electronics rack while the mechanical clamp is affixed to the frame 510. The second fastener 540 may provide a retention force that is perpendicular to the base 555, thereby providing a mechanical force on a horizontal flange or surface of the electronics rack, or may apply a force parallel to the horizontal base 555, thereby providing a mechanical force on a vertical flange or surface of the electronics rack.

A lateral clamp 550 may be affixed to a side portion of the frame 510 to provide a lateral force between the side portion of the frame 510 and a side portion of the electronics rack. In one exemplary embodiment, the apparatus may include two lateral clamps 550, one on each side of the frame 510, to provide opposing forces to the electronics rack in order to stabilize the center of the electronics rack during transportation, assembly, and installation. The lateral clamp 550 may be configured for providing a pressure between a side of the frame 510 and a side of the electronics rack wherein the lateral clamp 555 is manually or automatically adjustable, such as a scissor jack configuration.

A horizontal base 555 may be provided for supporting the frame 510, the horizontal base 555 including a mechanical interface 580 for a material handling device, at least one castor 560 and at least one floor lock 570. In one exemplary embodiment, the base 555 includes four castors 560. The mechanical interface 580 may be configured to interface with a forklift fork.

In one exemplary embodiment, the apparatus 500 is an electronics rack transportation container including a frame 510 having a vertical orientation configured for supporting an electronics rack, the frame 510 having an upper mechanical fastener 530 for securing an upper portion of the electronics rack, a lower mechanical fastener 540 for securing a lower portion of the electronics rack, a left side clamp 550 for providing a first lateral force between a left side of the frame 510 and a left side of the electronics rack, a right side clamp 550 for providing a second lateral force between a right side of the frame 510 and a right side of the electronics rack, The electronics rack transportation container may further include a front cover 515 configured to be affixed to a front side of the frame 510 and a back cover 520 configured to be affixed to a back side of the frame 510 such that the back cover 520 and the front cover 515 enclose the electronics rack when the front cover 515 is affixed to the front side of the frame 510 and the back cover 520 is affixed to the back side of the frame 510. The electronics rack transportation container may further include a horizontal base 555 for supporting the frame 510, the base 555 including a mechanical interface 580 for a material handling device, at least one castor 560 and at least one floor lock 570. In addition, the electronics rack transportation container may include a lifting ring 545 affixed to the upper portion of the frame 510.

Figure 6:
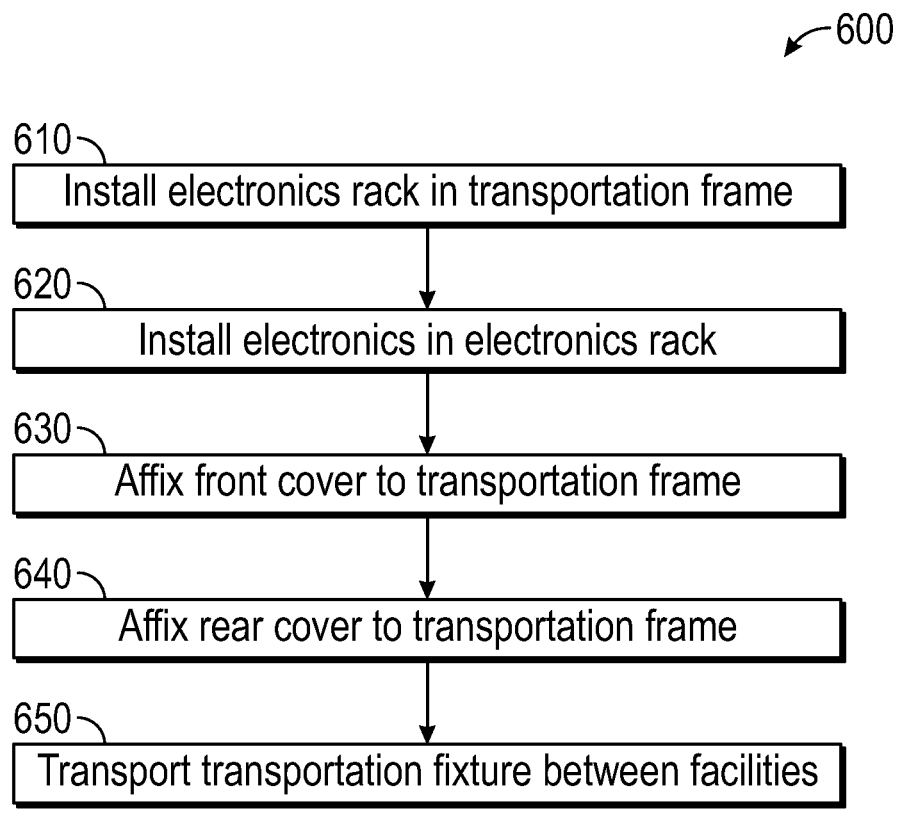
FIG. 6 a flow chart illustrating an exemplary method for configuring an exemplary transportation fixture for transportation of an aircraft electronics rack according to another exemplary embodiment.

Turning now to FIG. 6, a flow chart illustrating method for configuring an exemplary transportation fixture for transportation of an aircraft electronics rack is shown. In this exemplary embodiment, the method 600 is first operative for installing 610 an electronics rack into a transportation frame having a vertical orientation wherein an upper portion of the electronics rack is coupled to an upper portion of the transportation frame and a lower portion of the electronics rack is coupled to a lower portion of the transportation frame. In addition, the transportation frame may include a horizontal base for supporting the transportation frame wherein the horizontal base may include a mechanical interface for a material handling device, at least one castor and at least one floor lock. In addition, the transportation frame may include a left side clamp for providing a first lateral force between a left side of the transportation frame and a left side of the electronics rack and a right side clamp for providing a second lateral force between a right side of the transportation frame and a right side of the electronics rack.

The method is next configured for installing 620 an electronic component into the electronics rack. The electronics may include aircraft radio components, aircraft radio components, aircraft satellite communications components or the like. The electronic component may include multiple electronic devices connected with interconnecting communication cables, power supplies, power supply cables, grounding cables and the like.

The method is next operative for affixing 630 a front cover to a front side of the transportation frame. The front cover may be secured to the frame by a plurality of retention clips wherein a first portion of the retention clip is connected to the front cover and a second portion of the retention clip is connected to the frame. The exemplary clip may be a latch, a catch, hook and loop fastener or any clip or combination of clips that may provide sufficient retention force to keep the front cover secured to the frame during transportation of the electronics rack.

The method is next operative for affixing 640 a back cover to a back side of the transportation frame. As with the front cover, the back cover may be affixed to the frame with a latch, a catch, hook and loop fastener or any clip or combination of clips that may provide sufficient retention force to keep the back cover secured to the frame during transportation of the electronics rack. The back cover and the front cover are configured to provide environmental protection to the electronics rack.

The method may next be operative to transport 650 the transportation fixture. For example, in the instance of an aircraft electronics rack, the transportation fixture may be transported from an electronics assembly facility in one location, to an aircraft assembly facility in a second location. The transportation fixture may be transported via truck within a truck trailer, via sea container, or via cargo aircraft. In one exemplary embodiment, the transportation fixture is returned to the assembly facility once the aircraft electronics rack is installed in an aircraft.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. It should be understood that various changes can be made in the function and arrangement of elements without departing from the scope of the disclosure as set forth in the appended claims and the legal equivalents thereof.

What is claimed is:

1. A transport fixture for transporting an electronics rack comprising:
   a frame configured in a vertical orientation configured to receive the electronics rack, a front cover and a back cover, wherein the front cover and the back cover are configured to enclose the electronics rack when the front cover is attached to the frame and when the back cover is attached to the frame and wherein the front cover and the back cover are removable to allow access to the electronics rack from a back side of the transport fixture and a front side of the transport fixture and to allow removal of the electronics rack from the transport fixture;
   a first fastener for mechanically coupling a top portion of the electronics rack to a top portion of the frame;
   a second fastener for coupling a bottom portion of the electronics rack to a bottom portion of the frame;
   a first lateral clamp for providing a first pressure between a first side of the frame and a first side of the electronics rack at a first point on the first side of the electronics rack between the top portion of the electronics rack and the bottom portion of the electronics rack, wherein the first lateral clamp is adjustable in a direction orthogonal to the first side of the electronics rack and wherein the first pressure is applied orthogonally to the first side of the electronics rack at the first point;
   a second lateral clamp for providing a second pressure between a second side of the frame and a second side of the electronics rack at a second point on the second side of the electronics rack between the top portion of the electronics rack and the bottom portion of the electronics rack, and wherein the second pressure is applied orthogonally to the first side of the electronics rack at the first point; and
   a horizontal base for supporting the frame, the base including a mechanical interface for a material handling device, at least one castor and at least one floor lock.

2. The apparatus of claim 1 wherein the second lateral clamp is not adjustable.

3. The apparatus of claim 1 wherein the front cover and the back cover provide environmental protection to the electronics rack.

4. The apparatus of claim 1 wherein the first lateral clamp is adjustable in a direction towards the second lateral clamp and wherein adjusting the first lateral clamp adjusts a lateral pressure between the first lateral clamp and the second lateral clamp.

5. The apparatus of claim 1 wherein the mechanical interface is configured to interface with a forklift fork.

6. The apparatus of claim 1 wherein the front cover is attached to a front of the frame using a plurality of front cover latches.

7. The apparatus of claim 1 wherein the back cover is attached to a back of the frame using a plurality of back cover latches.

8. The apparatus of claim 1 including the electronics rack wherein the electronics rack is populated with an electronic component while the electronics rack is installed in the frame.

9. The apparatus of claim 1 including a lifting ring affixed to the top portion of the frame.

10. An electronics rack transportation container comprising:
- a frame having a vertical orientation configured for supporting an electronics rack, the frame having an upper mechanical fastener for securing an upper portion of the electronics rack, a lower mechanical fastener for securing a lower portion of the electronics rack;
- a left side clamp for providing a first lateral force between a left side of the frame and a left side of the electronics rack at a first point on the first side of the electronics rack between the upper portion of the electronics rack and the lower portion of the electronics rack, wherein the left side clamp is adjustable in a direction orthogonal to the first side of the electronics rack and wherein the first pressure is applied orthogonally to the first side of the electronics rack at the first point;
- a right side clamp for providing a second lateral force between a right side of the frame and a right side of the electronics rack at a second point on the second side of the electronics rack between the upper portion of the electronics rack and the lower portion of the electronics rack, and wherein the second pressure is applied orthogonally to the first side of the electronics rack at the first point;
- a front cover configured to be affixed to a front side of the frame;
- a back cover configured to be affixed to a back side of the frame such that the back cover and the front cover enclose the electronics rack when the front cover is affixed to the front side of the frame and the back cover is affixed to the back side of the frame and wherein the front cover and the back cover are removable to allow access to the electronics rack from a back side of the electronics rack transportation container and a front side of the electronics rack transportation container and to allow removal of the electronics rack from the electronics rack transportation container;
- a horizontal base for supporting the frame, the base including a mechanical interface for a material handling device, at least one castor and at least one floor lock.

11. The electronics rack transportation container of claim 10 including a lifting ring affixed to the upper portion of the frame.

* * * * *